(12) United States Patent
Yoshida

(10) Patent No.: US 8,975,190 B2
(45) Date of Patent: Mar. 10, 2015

(54) PLASMA PROCESSING METHOD

(71) Applicant: Tokyo Electron Limited, Tokyo (JP)

(72) Inventor: Ryoichi Yoshida, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/036,240

(22) Filed: Sep. 25, 2013

(65) Prior Publication Data

US 2014/0083975 A1    Mar. 27, 2014

Related U.S. Application Data

(60) Provisional application No. 61/708,766, filed on Oct. 2, 2012.

(30) Foreign Application Priority Data

Sep. 25, 2012  (JP) ................................. 2012-211371
Sep. 24, 2013  (JP) ................................. 2013-196824

(51) Int. Cl.
  *H01L 21/302*  (2006.01)
  *H01L 21/461*  (2006.01)
  *H01J 37/32*  (2006.01)

(52) U.S. Cl.
  CPC ..... *H01J 37/32009* (2013.01); *H01J 37/32091* (2013.01); *H01J 37/32155* (2013.01)

USPC ............. 438/714; 438/723; 438/724; 216/58; 216/72; 216/74; 216/79

(58) Field of Classification Search
  None
  See application file for complete search history.

(56) References Cited

U.S. PATENT DOCUMENTS 6,811,956 B1 *  11/2004  Gabriel .......................... 430/313
2002/0016078 A1 *  2/2002  Ionov et al. ................... 438/710

FOREIGN PATENT DOCUMENTS

JP        2003-163349 A        6/2003

* cited by examiner

*Primary Examiner* — Duy Deo
(74) *Attorney, Agent, or Firm* — Rothwell, Figg, Ernst & Manbeck, P.C.

(57) ABSTRACT

A plasma processing method includes a surface improving step of improving a surface of the photoresist film by performing plasma processing using a hydrogen-containing gas as a processing gas and an etching step of etching the SiON film by performing plasma processing using a processing gas including a gas containing a CHF-based gas and a chlorine-containing gas while using as a mask the photoresist film having the improved surface.

16 Claims, 13 Drawing Sheets

PLASMA PROCESSING METHOD

CROSS-REFERENCE TO RELATED APPLICATIONS

This application claims priority to Japanese Patent Application No. 2012-211371 filed on Sep. 25, 2012, Japanese Patent Application No. 2013-196824 filed on Sep. 24, 2013 and U.S. Provisional Application No. 61/708,766 filed on Oct. 2, 2012, the entire contents of which are incorporated herein by reference.

FIELD OF THE INVENTION

The present invention relates to a plasma processing method for performing plasma etching an etching target film on a substrate such as a semiconductor wafer, a liquid crystal substrate or the like while using a photoresist film as a mask.

BACKGROUND OF THE INVENTION

In a process of forming a semiconductor device, a pattern such as a line and space (groove) pattern, a hole (opening) pattern or the like which is used for forming, e.g., a gate electrode, a wiring or the like, on a substrate, e.g., a semiconductor wafer (hereinafter, simply referred to as "wafer") is formed by etching a plurality of films laminated as etching target films on the wafer by converting a predetermined processing gas to a plasma while using a patterned photoresist film as a mask.

At this time, for example, when a SiON (silicon oxynitride) film as an etching target film is etched, a processing gas including a gas containing a CHF-based gas such as $CHF_3$ or the like is used (see, e.g., Japanese Patent Application Publication No. 2003-163349).

The SiON film has good optical characteristics in a far infrared ray region. Therefore, when a pattern is formed in a photoresist film by a photolithography technique, the SiON film effectively serves as an antireflection film for preventing reflection from an underlying film.

However, if such a SiON film is plasma-etched by the processing gas including the gas containing a CHF-based gas while using the photoresist film as a mask, the surface of the photoresist film becomes rough. The surface roughness of the pattern sidewall is transferred when the SiON film is etched, which causes a so-called striation in which the pattern sidewall of the SiON film (sidewall of line) becomes irregular (concave-convex). If the striation occurs, the leakage current between wirings may be increased, or defects such as short circuit or the like may occur. Therefore, there is a need to prevent the striation.

SUMMARY OF THE INVENTION

In view of the above, the present invention provides a plasma processing method capable of preventing occurrence of striation on a surface of a photoresist film when etching a SiON film and forming a good etching shape.

When the plasma etching is performed on the SiON film as an etching target film by using a processing gas including a gas containing a CFH-based gas while using the photoresist film as a mask, the striation occurs on the pattern sidewall of the SiON film. In that case, if the plasma processing using a hydrogen-containing gas is performed before the etching of the SiON film, the surface state of the photoresist film can be improved, and the irregular portions (concave-convex portions) of the pattern sidewall can be removed.

However, it has been found from an experiment that even though the surface of the photoresist film is improved before the etching of the SiON film, the surface of the resist film may become rough by etching to be performed later.

By repeating experiments to solve such a problem, it has been found that when the SiON film is etched by a processing gas to which a chlorine-containing gas is added, the improved pattern sidewall of the photoresist film can be transferred while the etching is performed. The present invention has been conceived from the above conclusion.

In accordance with an aspect of the present invention, there is provided a plasma processing method for performing plasma etching on a SiON film while using as a mask a photoresist film having a predetermined pattern, the method including a surface improving step of improving a surface of the photoresist film by performing plasma processing using a hydrogen-containing gas as a processing gas; and an etching step of etching the SiON film by performing plasma processing using a processing gas including a gas containing a CHF-based gas and a chlorine-containing gas while using as a mask the photoresist film having the improved surface. In this aspect, preferably, the surface improving step and the etching step are repeated at least twice.

In this aspect, preferably, the chlorine-containing gas contains at least one of $Cl_2$ gas, $BCl_3$ gas and $CCl_4$ gas. In this aspect, preferably, the hydrogen-containing gas is a gaseous mixture of $H_2$ gas and Ar gas or a gaseous mixture of $H_2$ gas, $N_2$ gas and $CH_4$ gas. a high frequency power for plasma generation in the etching step is greater than a high frequency power for plasma generation in the surface improving step. In this aspect, preferably, the CHF-based gas contained in the gas containing a CHF-based gas is any one of $CH_2F_2$ gas, $CH_3F$ gas, and $CHF_3$ gas. In this aspect, preferably, the gas containing a CHF-based gas further contains a CF-based gas. In this aspect, preferably, the CF-based gas contains at least one of $CF_4$ gas and $C_4F_8$ gas.

In accordance with another aspect of the present invention, there is provided a plasma processing method for performing plasma etching on an underlying film while using as a mask a photoresist film formed in a predetermined pattern on the underlying film, the method including a first step of improving a surface of the photoresist film by performing plasma processing using a hydrogen-containing gas as a processing gas; and a second step of etching the underlying film by performing plasma processing using a processing gas including a gas containing a CHF-based gas and a chlorine-containing gas while using as a mask the photoresist film having the improved surface. In this aspect, preferably, the first and the second step are repeated at least twice. In this aspect, preferably, a high frequency power in the plasma processing of the second step is greater than a high frequency power in the plasma processing of the first step.

EFFECT OF THE INVENTION

In accordance with the present invention, it is possible to provide a plasma processing method capable of preventing occurrence of striation and obtaining a good etching shape by improving the surface of the photoresist film to removing the surface roughness and performing etching while maintaining the improved surface state.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
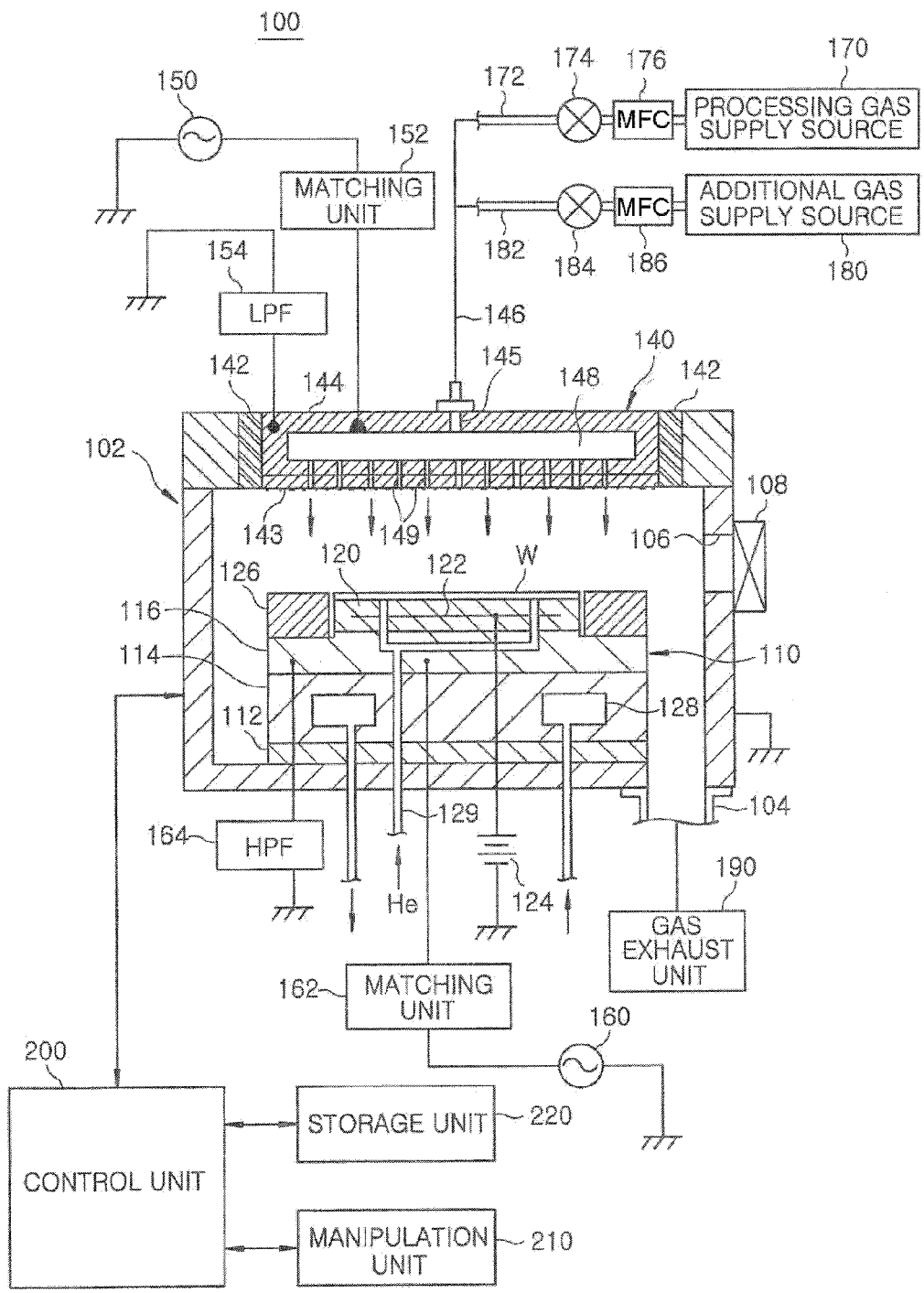
FIG. 1 is a vertical cross sectional view showing a schematic configuration example of a plasma processing apparatus capable of performing a plasma processing method in accordance with an embodiment of the present invention.

Hereinafter, an embodiment of the present invention will be described with reference to the accompanying drawings. In the present specification and the drawings, like reference numerals refer to like elements having substantially the same functions, and redundant description thereof will be omitted. In the present specification, 1 mTorr is $(10^{-3} \times 101325/760)$ Pa, and 1 sccm is $(10^{-6}/60)$ m$^3$/sec.

(Configuration Example of Plasma Processing Apparatus)

First, a configuration example of a plasma processing apparatus to which a plasma processing method in accordance with an embodiment of the present invention is applied will be described. FIG. 1 is a cross sectional view showing a schematic configuration of a plasma processing apparatus 100 of the present embodiment. Here, a capacitive coupled plasma processing apparatus having a parallel plate type electrode structure will be described as an example.

As shown in FIG. 1, the plasma processing apparatus 100 includes a processing chamber 102 constituted by an approximately cylindrical processing vessel. The processing chamber 102 is formed of, e.g., aluminum alloy, and an inner wall surface thereof is coated with, e.g., an alumina film or the like. The processing chamber 102 is grounded.

A lower electrode 110 is provided at a bottom portion of the processing chamber 102. The lower electrode 110 includes a columnar shaped susceptor support 114 that is disposed at the bottom portion of the processing chamber 102 through an insulating plate 112 made of ceramic or the like, and a susceptor 116 disposed on the susceptor support 114. The susceptor 116 constitutes a main body of the lower electrode, and a wafer W is mounted thereon. Thus, the lower electrode 110 serves as a mounting table for mounting thereon a wafer W.

Provided on the top surface of the susceptor 116 is an electrostatic chuck 120 for attractivity holding the wafer W with an electrostatic force. The electrostatic chuck 120 includes an electrode 122 made of a conductive film interposed between a pair of insulating films or insulating sheets, and a DC power supply 124 is electrically connected to the electrode 122. By applying a DC voltage from the DC power supply 124 to the electrode 122, an electrostatic force such as a Coulomb force or the like is generated on the top surface of the electrostatic chuck 120. Accordingly, the wafer W is attracted and held thereon.

A focus ring (correction ring) 126 for improving etching uniformity is provided on the top surface of the susceptor 116 so as to surround the electrostatic chuck 120 and the wafer W. The focus ring 126 is formed of a conductive member (e.g., silicon).

A coolant channel 128 having, e.g., an annular shape, is formed in the susceptor support 114. A coolant (e.g., cooling water) from a chiller unit (not shown) provided at the outside is supplied into the coolant channel 128 and circulates therein. A processing temperature of the wafer W on the susceptor 116 may be controlled by a temperature of the coolant.

In the susceptor support 114, a heat transfer gas (e.g., He gas) from a heat transfer gas supply unit (not shown) is supplied to a space between the top surface of the electrostatic chuck 120 and the backside of the wafer W through a heat transfer gas supply line 129.

Further, the lower electrode 110 is not limited to the configuration shown in FIG. 1. For example, the lower electrode 110 may be vertically moved by an elevation unit (not shown) by interposing a bellows made of aluminum between the insulating plate 112 and the bottom surface of the processing chamber 102. Accordingly, the gap between the lower electrode 110 and the upper electrode 140 can be adjusted.

The upper electrode 140 is provided above the lower electrode 110 so as to face the lower electrode 110 in parallel. A space between the upper electrode 140 and the lower electrode 110 is a plasma generating space. The upper electrode 140 is supported at a ceiling portion of the processing chamber 102 through an insulating shield member 142.

The upper electrode 140 mainly includes an electrode plate 143 and an electrode holder 144 for detachably holding the electrode plate 143. A gas inlet port 145 for introducing gases required for etching (a processing gas and a added gas which will be described later) into the processing chamber 102 is provided in the electrode holder 144.

As a processing gas supply system for supplying a processing gas used for plasma processing of the present embodiment which will be described later, a processing gas supply source 170 is connected to the gas inlet port 145 via a processing gas supply line 172. Further, as an added gas supply system for supplying an added gas used for plasma processing of the present embodiment, an added gas supply source 180 is connected to the gas inlet port 145 via an added gas supply line 182. Here, the processing gas may be a hydrogen-containing gas used for improving the surface of the photoresist film (e.g., a gaseous mixture of $H_2$ gas and Ar gas), or a gas containing a CHF-based gas $CHF_3$ gas) used for etching the SiON film. The added gas may be a chlorine-containing gas (e.g., $Cl_2$ gas) used for etching the SiON film.

Specifically, the processing gas supply line 172 and the added gas supply line 182 are connected to the gas inlet port 145 via the respective gas supply lines 146. Accordingly, the processing gas from the processing gas supply line 172 and the added gas from the added gas supply line 182 are mixed in the gas supply line 146 to be supplied through the gas inlet port 145.

Provided at the processing gas supply line 172 and the added gas supply line 182 are opening/closing valves 174 and 184, and mass flow controllers (MFC) 176 and 186 serving as flow rate controllers for controlling flow rates of gases. Specific examples of the processing gas and the added gas will be described later.

The electrode holder 144 has therein, e.g., an approximately cylindrical gas diffusion space 148 capable of uniformly diffusing the gas introduced from the gas supply line 146. A plurality of gas injection openings 149 for injecting the gas from the gas diffusion chamber 148 is formed in the bottom portion of the electrode holder 144 and the electrode plate 143, so that the gas diffused in the gas diffusion space 148 can be uniformly injected through the gas injection openings 149 toward the plasma generation space. Therefore, the upper electrode 140 serves as a shower head for supplying a gas into the processing chamber 102.

In FIG. 1, a single processing gas supply system and a single added gas supply system are illustrated. However, when many kinds of gases are supplied, a plurality of processing gas supply systems and a plurality of added gas supply systems may be provided.

The upper electrode 140 of the present embodiment is of a so-called pre-mix type in which the processing gas and the added gas are premixed and supplied into the processing chamber 102. However, the upper electrode 140 may be of a post-mix type in which individual gases are supplied into the processing chamber 102 separately.

In the present embodiment, the electrode holder 144 of the upper electrode 140 is made of a conductive material (e.g., aluminum having an anodically oxidized surface) and has a water cooling structure (not shown). The electrode plate 143 is preferably made of a conductor or semiconductor having a low resistance with low Joule heat, e.g., a silicon-containing material. An example of such a material includes, e.g., silicon or SiC.

A first high frequency power supply (upper high frequency power supply) 150 is electrically connected to the upper electrode 140 via a matching unit 152. The first high frequency power supply 150 outputs a high frequency power (upper high frequency power) having a frequency of 13.56 MHz or more, e.g., 60 MHz. The magnitude of the high frequency power of the first high frequency power supply 150 is variable.

The matching unit 152 serves to match a load impedance to an internal (or output) impedance of the first high frequency power supply 150 such that the output impedance of the first high frequency power supply 150 seemingly coincides with the load impedance when a plasma is generated in the processing chamber 102.

A second high frequency power supply (lower high frequency power supply) 160 is electrically connected to the susceptor 116 of the lower electrode 110 via a matching unit 162. Ions are attracted toward the wafer W by supplying a high frequency power from the second high frequency power supply 160 to the susceptor 116. The second high frequency power supply 160 outputs a high frequency power (lower high frequency power) having a frequency ranging from 300 kHz to 13.56 MHz, e.g., 13.56 MHz. The magnitude of the high frequency power of the second high frequency power supply 160 is variable.

The matching unit 162 serves to match a load impedance to an internal (or output) impedance of the second high frequency power supply 160 such that the output impedance of the second high frequency power supply 160 seemingly coincides with the load impedance when a plasma is generated in the process chamber 102.

A low pass filter (LPF) 154 for passing a high frequency from the second high frequency power supply 160 to a ground while blocking a high frequency from the first high frequency power supply 150 is electrically connected to the upper electrode 140. The low pass filter (LPF) 154 is preferably formed of an LR filter or an LC filter. However, it may be sufficient to employ only one conducting wire since only one single conducting wire can provide a high enough reactance to the high frequency from the first high frequency power supply 150. Meanwhile, a high pass filter (HPF) 164 for passing the high frequency from the first high frequency power supply 150 to the ground is electrically connected to the susceptor 116 of the lower electrode 110. Further, a variable DC power supply (not shown) is connected to the upper electrode 140 so that a predetermined DC voltage can be applied to the upper electrode 140.

A gas exhaust port 104 is formed at the bottom portion of the processing chamber 102, and a gas exhaust unit 190 including a vacuum pump or the like is connected to the gas exhaust port 104. By exhausting the processing chamber 102 by the gas exhaust unit 190, the pressure in the processing chamber 102 can be reduced to a predetermined vacuum level.

Further, a loading/unloading port 106 for the wafer W is provided at the sidewall of the processing chamber 102. The loading/unloading port 106 can be opened and closed by a gate valve 108. Moreover, a deposition shield (not shown) for preventing etching by-product (deposit) from being attached to the processing chamber 102 may be detachably provided at the inner wall of the processing chamber 102.

The respective components of the plasma processing apparatus 100 are connected to and controlled by a control unit (entire control unit) 200. The control unit 200 is connected to a manipulation unit 210 including a keyboard through which an operator inputs commands to manage the plasma processing apparatus 100, a display for visualizing and displaying operation states of the plasma processing apparatus 100, and the like.

Moreover, the control unit 200 is connected to a storage unit 220 for storing programs for implementing various processes (plasma processes such as surface improving process, etching process and the like) performed in the plasma processing apparatus 100 under the control of the control unit 200, recipe data required for executing the programs, and the like.

The storage unit 220 stores recipes for performing necessary processes such as a process recipe for performing processing, e.g., plasma etching and ashing of a wafer, and a cleaning recipe for cleaning an interior of the processing chamber, and the like. These recipes include a plurality of parameters such as a control parameter for controlling each component of the plasma processing apparatus 100, a setting parameter, and the like. The process recipe may include parameters, e.g., a flow rate ratio of the processing gas and the added gas, a pressure in the processing chamber, an upper high frequency power, a lower high frequency power, a temperature of the upper electrode, a temperature of the lower electrode, and the like.

These recipes may be stored in a hard disk or a semiconductor memory, and may be set in a predetermined position of the storage unit 220 while being accommodated in a portable computer-readable storage medium such as a CD-ROM, a DVD or the like.

The control unit 200 reads out a desired process recipe from the storage unit 220 based on commands from the manipulation unit 210 and controls the components, thereby performing a desired process in the plasma processing apparatus 100. Further, the control unit 200 can edit the recipes by the manipulation from the manipulation unit 210.

When the plasma etching is performed on the wafer W by using the plasma processing apparatus 100, first, the gate valve 108 is opened and the wafer W is loaded and mounted on the lower electrode 110. The wafer W is attracted and held on the electrostatic chuck 120 and the gate valve 108 is closed. In order to effectively cool the wafer W, the heat transfer gas (e.g., He gas) is supplied to the backside of the wafer W through the heat transfer gas supply line 129. Accordingly, the upper electrode 140, the lower electrode 110 and the sidewall of the processing chamber 102 are controlled to predetermined temperatures.

A pressure in the processing chamber 102 is decreased to a predetermined vacuum level by exhausting the interior of the processing chamber 102 by the gas exhaust unit 190, and the processing gas is introduced at a predetermined flow rate into the processing chamber 102 from the processing gas supply source 170. At this time, if an added gas is required, the added gas is introduced at a predetermined flow rate from the added gas supply source 180.

A predetermined upper high frequency power (e.g., 60 MHz) is applied from the first high frequency power supply 150 to the upper electrode 140 and a predetermined lower high frequency power (e.g., 13.56 MHz) is applied from the second high frequency power supply 160 to the lower electrode 110. Accordingly, a plasma of the processing gas or a plasma of the processing gas and the added gas is generated in the plasma generating space on the wafer W. As a consequence, the plasma processing is performed on the etching target film on the wafer W.

Figure 2:
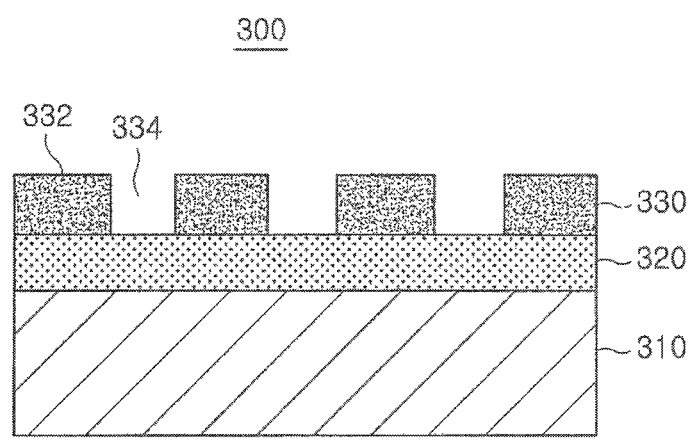
FIG. 2 is a cross sectional view showing a film structure including an etching target film in the embodiment of the present invention.

(Etching Target Film)

hereinafter, a film structure of an etching target film to be etched by the plasma processing of the present embodiment will be described with reference to the drawings. Here, an SiON film formed at the surface of the wafer W will be described as an example of an etching target film as an underlying film. Lines and spaces are formed on the SiON film by etching the SiON film by a plasma while using the photoresist film as a mask. FIG. 2 is a cross sectional view showing a film structure including the SiON film as an etching target film. The SiON film serves as a mask in the case of etching an organic film formed thereunder.

The film structure 300 shown in FIG. 2 includes, e.g., an SiON film 320 formed on the organic film 310 and a photoresist film 330 formed on the SiON film 320. Lines 332 and spaces 334 are patterned on the photoresist film 330.

The film structure 300 may have a multilayer film structure in which an insulating film or a silicon film (e.g., a polysilicon film) is formed below the organic film 310. In that case, the organic film formed thereunder may be etched while using as a mask the resist film and the SiON film patterned by the etching of the present embodiment, and these may be used as a multilayer mask film of the films (the insulating film, the silicon film and the like) formed below the organic film.

The photoresist film 330 may be formed of an ArF-based organic film. The mask may be formed of a SiON film, a SiARC film, an organic film, an amorphous carbon film or the like. The photoresist film 330 may be a photoresist film of i-line (wavelength: 365 nm).

An antireflection film may be formed between the SiON film 320 and the photoresist film 330 formed thereon. The antireflection film may be formed of an organic antireflection film or an Si-containing antireflection film. The antireflection film is etched together with the SiON film 320 during the etching of the SiON film 320.

Figure 3:
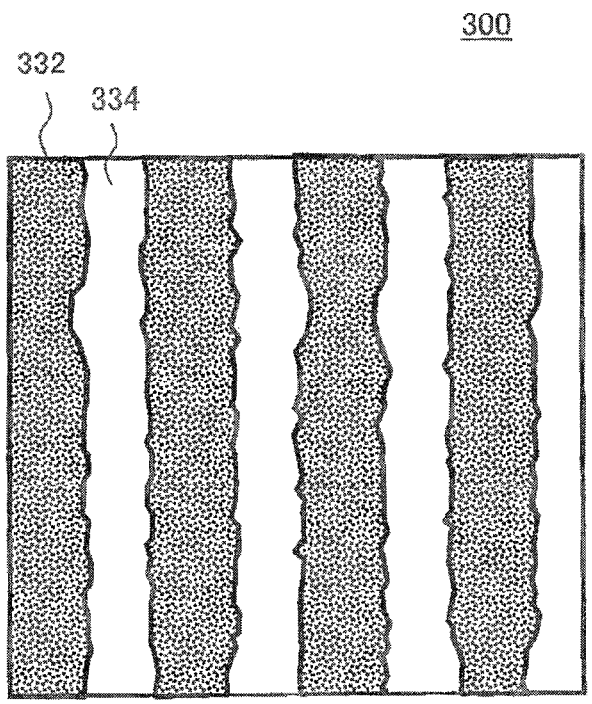
FIG. 3 is a top view showing a photoresist film before processing in the embodiment of the present invention.

When the SiON film 320 is etched, it is preferable to use the gas containing a CHF-based gas (e.g., a gaseous mixture of $CF_4$ gas and $CHF_3$ gas) as a processing gas. However, if the SiON film 320 is plasma-etched by using such a processing gas, the surface of the photoresist film 330 becomes rough. The surface roughness of the pattern sidewall is transferred to the SiON film 320 when the SiON film 320 is etched. Therefore, as shown in FIG. 3, a so-called striation in which the pattern sidewall of the SiON film 320 (sidewall of line (groove)) becomes irregular (convexoconcave) occurs.

Figure 4:
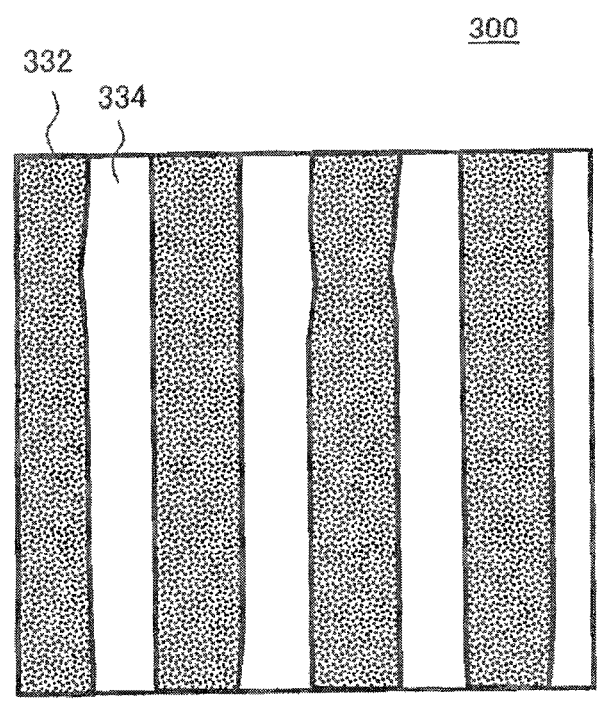
FIG. 4 is a top view showing the photoresist film after a process of improving a surface of the photoresist film in the embodiment of the present invention.

To that end, the present inventors have performed various experiments. As a result, the present inventors have found that the surface of the photoresist film 330 can be greatly improved as shown in FIG. 4, and the irregularity of the pattern sidewall can removed by performing plasma processing using a hydrogen-containing gas before the etching of the SiON film 320.

However, it has also been found by the experiments that even if the surface of the photoresist film 330 is improved before the etching of the SiON film 320, the surface of the photoresist film 330 becomes rough as a next etching process using the gas containing a CHF-based gas (e.g., a gaseous mixture of $CF_4$ gas and $CHF_3$ gas) as a processing gas proceeds.

Therefore, even if the surface of the photoresist film 330 is improved by the surface improving process, the final etching shape becomes poor and the surface improving effect of the photoresist film 330 cannot be sufficiently obtained.

By repeating experiments to solve the above problem, it has been found that when the SiON film 320 is etched by using a processing gas including a gas containing a CHF-based gas to which a chlorine-containing gas is added, the etching can be carried out while maintaining the surface state of the pattern sidewall of the improved photoresist film 330.

Here, the case of etching the SiON film after the surface improving process by using the processing gas to which $Cl_2$ gas as a chlorine-containing gas is added will be compared with the case of etching the SiON film by using the processing gas to which $Cl_2$ gas is not added. The processing gas is a gaseous mixture of $CHF_3$ gas and $CF_4$ gas.

Figure 5:
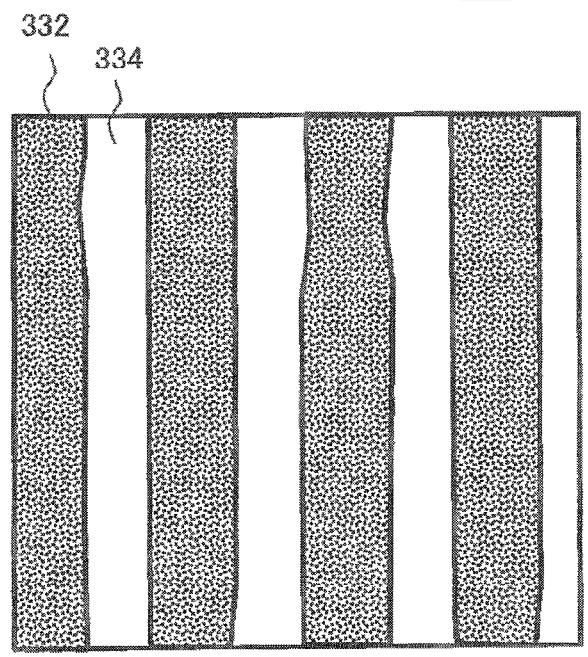
FIG. 5 is a top view showing the photoresist film after a process of etching a SiON film in the embodiment of the present invention.
Figure 6:
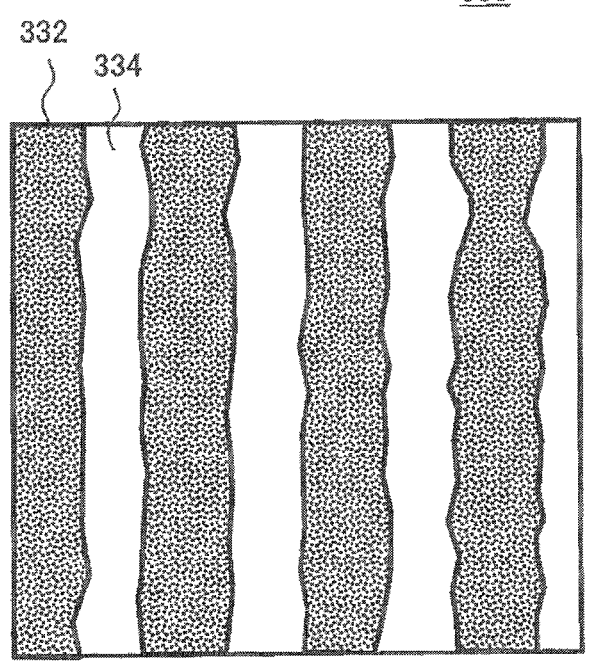
FIG. 6 is a top view showing a photoresist film after a process of etching a SiON film in a comparison example.

FIG. 5 shows an etching shape obtained in the case of performing etching using a processing gas containing $Cl_2$ gas, and FIG. 6 shows an etching shape obtained in the case of performing etching using a processing gas that does not contain $Cl_2$ gas. When the processing gas contains $Cl_2$ gas as in the case of FIG. 5, the etching shape is improved compared to that obtained when the processing gas does not contain $Cl_2$ gas as in the case of FIG. 6. This is because when the processing gas containing $Cl_2$ gas is used, the amount of deposits attached to the pattern wall during the etching is reduced, and the surface state of the photoresist film does not become poor.

(Plasma Processing of the Present Embodiment)

Hereinafter, the plasma processing of the present embodiment which is based on the above conclusion will be described in detail. Here, the plasma processing apparatus 100 is used, and the case of forming lines and spaces by plasma-etching an SiON film on the wafer W while using a photoresist film as a mask will be described as an example.

Here, as shown in FIG. 2, the film structure 300 includes, e.g., the SiON film 320 formed on the organic film 310 and the photoresist film 330 formed on the SiON film 320. Lines 332 and spaces 334 are patterned in the photoresist film 330.

Figure 7A:
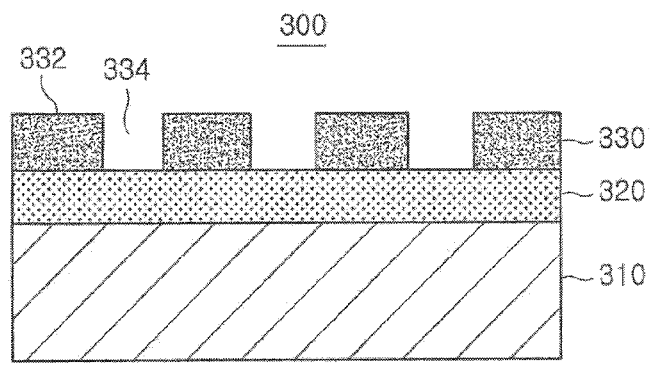
FIG. 7A is a process diagram of the plasma processing of the present embodiment and conceptually shows a cross section of a film structure before processing.
Figure 7B:
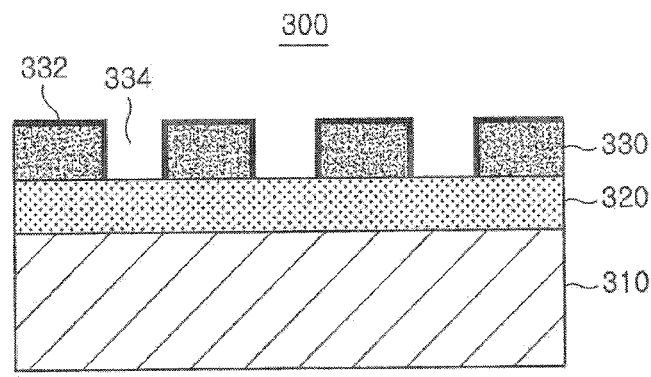
FIG. 7B is a process diagram continued from FIG. 7A and conceptually shows a cross section of the film structure after the process of improving a surface of a photoresist film.
Figure 7C:
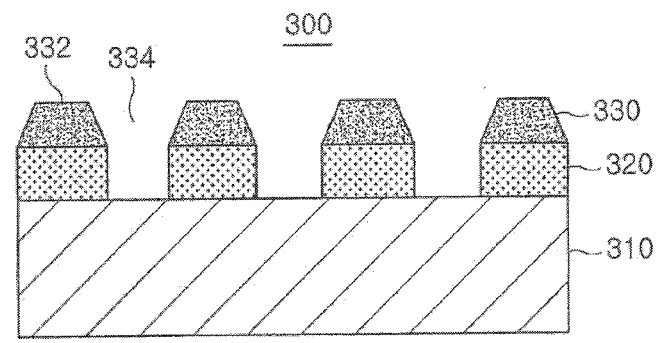
FIG. 7C is a process diagram continued from FIG. 7B and conceptually shows a cross section of the film structure after the process of etching the SiON film.

The plasma processing of the present embodiment is divided into a surface improving process for the photoresist film 330 (first step) which is performed first and an etching process for the SiON film 320 (second step) which is performed later. Hereinafter, the plasma processing will be described in two steps. FIGS. 7A to 7C are process diagrams of the plasma processing of the present embodiment. FIG. 7A conceptually shows a cross section of the film structure 300 before processing of the present embodiment. FIG. 7B conceptually shows a cross section of the film structure 300 after a process of improving the surface of the photoresist film. FIG. 7C conceptually shows a cross section of the film structure 300 after a process of etching the SiON film 320.

(Surface Improving Process for Photoresist Film)

In the surface improving process (first step) for the photoresist film, the plasma processing is performed on the wafer W having the film structure 300 shown in FIG. 7A by using a gaseous mixture of Ar gas and $H_2$ gas as a hydrogen-containing gas. The flow rate ratio of the processing gas ($H_2$ gas/Ar gas) is, e.g., 100/800 sccm. The entire flow rate of the processing gas is preferably 1100 sccm or less and more preferably 900 sccm or less. The flow rate of $H_2$ gas is preferably smaller than 120 sccm and more preferably smaller than 100 sccm. The flow rate of Ar gas is preferably smaller than 960 sccm and more preferably smaller than 900 sccm.

As for other processing conditions, a pressure in the processing gas is preferably 100 mTorr or less. The lower high frequency power is preferably 150 W or less and more preferably 100 W or less. The experiments that have been executed by changing only the lower high frequency power condition show that when the lower high frequency power ranges from 0 W to 100 W, especially when the lower high frequency power ranges from 0 W to 50 W, the surface improving effect can be improved by applying the lower high frequency power, whereas when the high frequency power is higher than 50 W, the surface improving effect is decreased as the lower high frequency power is increased. Therefore, it is actually preferable to apply the lower high frequency power of 50 W or less.

The upper high frequency power is preferably 1000 W or less and more preferably 800 W or less. The experiments that have been executed by changing only the upper high frequency power condition show that when the upper high frequency power ranges from 300 W to 800 W, the surface improving effect is improved as the upper high frequency power is decreased. Further, a temperature of the lower electrode is preferably 10° C. or above and more preferably 30° C. or above.

Here, the pressure in the processing chamber was set to, e.g., 20 mTorr, and the lower high frequency power (e.g., 13.56 MHz) was not applied. In other words, the lower high frequency power was set to 0 W. The upper high frequency power (e.g., 60 MHz) was set to 300 W.

The plasma is generated under the above-described processing conditions, and the surface improving process of the photoresist film 330 is carried out. Accordingly, as shown in FIG. 7B, the surface of the photoresist film 330 is improved, and the state of the pattern sidewall can be improved. In other words, the surface of the photoresist film 330 is modified by performing the surface improving process using $H_2$ gas and Ar gas as the processing gas, which results in improvement of plasma resistance.

(Plasma Etching Process)

Next, a plasma etching process (second step) is performed while using, as a mask, the photoresist film 330 having the improved surface. Here, a plasma is generated by using a gaseous mixture of $CF_4$ gas and $CHF_3$ gas as a processing gas and $Cl_2$ gas as an added gas, and the SiON film 320 is etched. Accordingly, as shown in FIG. 7C, the SiON film can be etched while maintaining the improved pattern wall state of the photoresist film 330.

However, the photoresist film 330 is also etched by the etching. Therefore, in order to suppress the reduction of the photoresist film 330, the processing conditions are adjusted, and a chlorine-containing gas (e.g., $Cl_2$ gas) may be added to the gaseous mixture of $CF_4$ gas and $CHF_3$ gas. Since, however, the reduction of the photoresist film 330 is increased as the flow rate of $Cl_2$ gas is greater than that of $CHF_3$ gas, it is preferable to reduce the flow rate of $Cl_2$ gas.

The reduction of the photoresist film 330 can also be suppressed by increasing the upper high frequency power for plasma generation than that in the case of the surface improving process to increase the plasma density and the amount of deposits. In order to effectively maintain the improved surface state of the photoresist film, it is preferable to increase the flow rate ratio of $CHF_3$ gas and reduce the flow rate of $CF_4$ gas. The flow rate of $CF_4$ gas may be zero.

In view of the above, in order to perform etching while maintaining the improved surface state of the photoresist film and suppressing the reduction of the photoresist film 330, it is preferable to perform etching under the following conditions. Here, the case of using $CHF_3$ gas and $Cl_2$ gas as a processing gas will be described as an example.

[Specific Example of Etching Conditions of the Present Embodiment]

Pressure in the processing chamber: 15 mTorr

Flow rate ratio of the processing gas: $CHF_3$ gas/$Cl_2$ gas=250/27 sccm

Upper high frequency power: 60 MHz, 700 W

Lower high frequency power: 13.56 MHz, 100 W (Experiment Result in the Case of Performing Plasma Processing of the Present Embodiment)

Hereinafter, the experiment result obtained by actually performing the plasma processing under the above processing conditions will be described with reference to the accompanying drawing. Here, the experiment result is compared with the experiment result obtained by etching the SiON film 320 without adding $Cl_2$ gas to the processing gas after the surface improving process. The processing conditions in the case of etching the SiON film 320 without adding $Cl_2$ gas to the processing gas are described as follows.

[Specific Example of Etching Conditions of the Comparison Example]

Pressure in the processing chamber: 15 mTorr

Flow rate ratio of the processing gas: $CF_4$ gas/$CHF_3$ gas=80/50 sccm

Upper high frequency power: 60 MHz, 500 W

Lower high frequency power: 13.56 MHz, 1000 W

Figure 8:
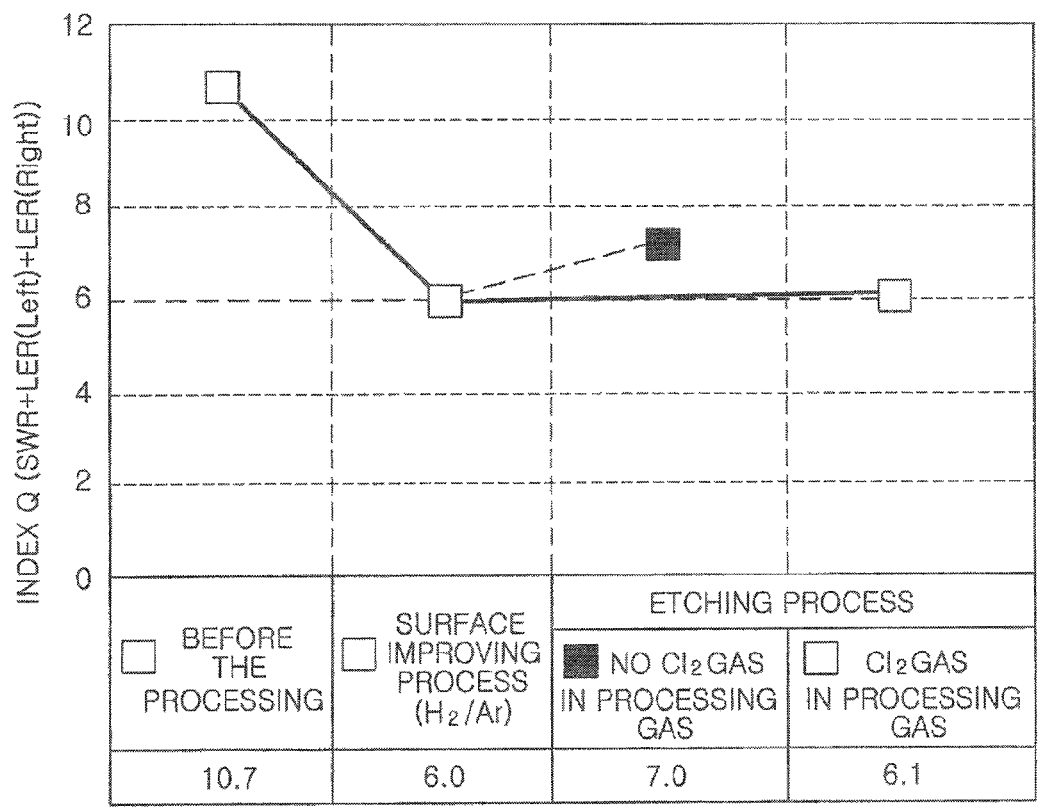
FIG. 8 is a table and a graph showing a experiment result in the case of performing the surface improving process ($H_2$/Ar) and the etching process of the present embodiment.

FIG. 8 is a graph and a table showing the results of the experiments. In FIG. 8, the vertical axis indicates an index Q of a pattern sidewall state. Here, as for the index Q of the pattern sidewall state, there is used combination of an index of space width deviation (SWR) and indexes (LER (Left), LER (Right)) of deviation of right and left edge positions of the line in the line and space that is an etching shape formed by the plasma processing.

Figure 9:
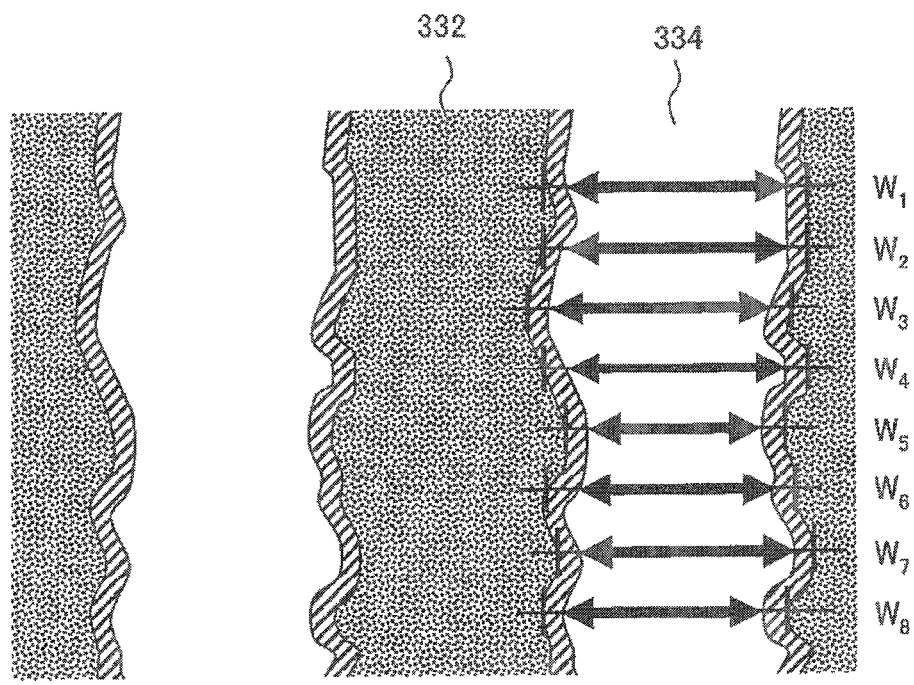
FIG. 9 explains an index of space width deviation which is included in an index Q shown in FIG. 8.

Hereinafter, the indexes will be described. FIG. 9 explains a space width deviation index, and FIG. 10 explains an index of deviation of right and left edge positions of a line. First, the space width deviation (SWR) is measured by a so-called multi point measurement. Specifically, as shown in FIG. 9, the space width deviation (non-uniformity) is calculated by measuring a space width Wi in a plurality of sections. Here, "deviation" SWR indicates a value of 3σ on the assumption that the standard deviation of each space width data is set to σ. A larger SWR indicates larger space width deviation.

Figure 10:
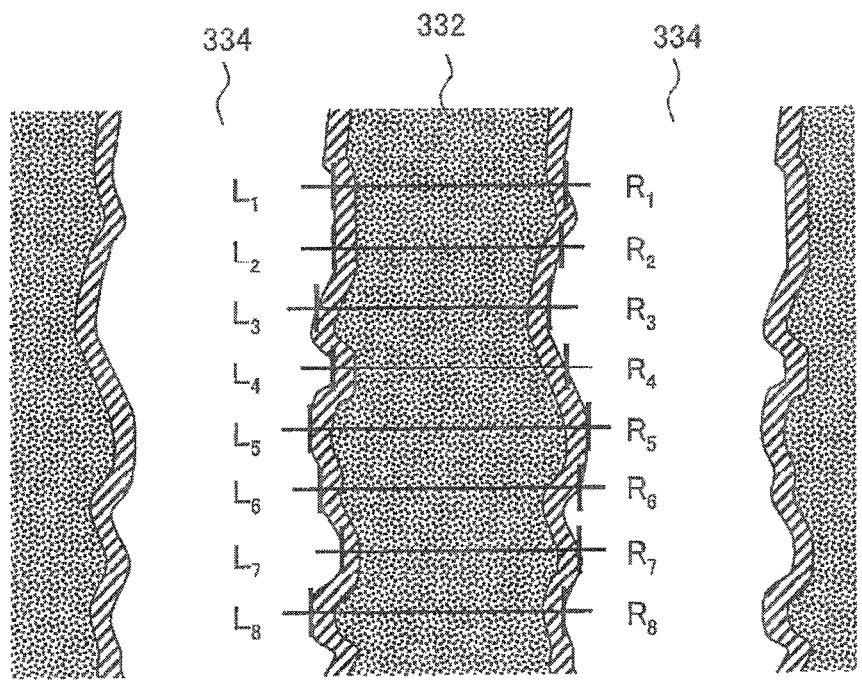
FIG. 10 explains an index of deviation of right and left edge positions of a line which is included in the index Q shown in FIG. 8.

Next, the deviation of right and left edge positions of the line (LER (Left), LER (Right)) is also measured by multi point measurement. Specifically, as shown in FIG. 10, the average of the deviation of the right and left edge positions (e.g., variation of a distance from a central line perpendicular to a plurality of lines to the edge, non-uniformity) is obtained by measuring edge positions in a plurality of sections. Here, "deviation" LER indicates a value of 3σ on the assumption that the reference deviation of each edge position data is set to σ. A larger LER indicates larger deviation of the line position. From the above, it is clear that as the index Q indicating the pattern sidewall state is decreased, the surface state of the photoresist film 330 becomes good.

The surface state (the pattern sidewall state) of the photoresist film 330 obtained by the experiment result was evaluated by using the index Q. As a result, it was found that due to the surface improving process ($H_2$/Ar) of the present embodiment, the index Q indicating the pattern sidewall state was remarkably decreased from 10.7 that is an index before the processing to 6.0, as shown in FIG. 8. This indicates the surface state of the pattern sidewall has been extremely improved.

By performing the etching using the processing gas of the present embodiment to which $Cl_2$ gas is added after the surface improving process is performed on the photoresist film 330, the index Q indicating the pattern sidewall state becomes 6.1 which is substantially the same as that obtained after the surface improving process. Therefore, it is clear that the etching can be performed while maintaining the surface state of the pattern sidewall.

In the case of performing etching without adding $Cl_2$ gas to the processing gas, the index Q indicating the pattern sidewall state is considerably increased from 6.0 to 7.0 after the surface improving process. This indicates that the surface state of the pattern sidewall becomes poor.

In the present invention, the SiON film 320 can be etched while maintaining the improved surface state (the surface state of the pattern sidewall) by adding a chlorine-containing gas to the processing gas in the etching process after the surface improving process of the photoresist film 330 is performed. Preferably, $Cl_2$ gas is added such that the flow rate ratio of $Cl_2$ gas to $CHF_3$ gas is greater than 0.1 and more preferably greater than or equal to 0.2.

Here, as for the data used for the index Q indicating the pattern sidewall state, the space width deviation (SWR) of the line and space, and the deviation of right and left edge positions of the line (LER (Left), LER (Right)) are described as examples. However, it is not limited thereto, and the line width deviation of the line and space (LWR) may be used, for example.

The line width deviation (LWR) is also measured by a so-called multipoint measurement. Specifically, for example, the deviation (nonuniformity) of the line width is calculated by measuring a line width in a plurality of sections. Here, "deviation" LWR indicates a value of 3σ on the assumption that the reference deviation of the line width data is set to a. A larger LWR indicates larger deviation of the line width.

The present embodiment has described the case of etching the SiON film 320 by performing once the surface improving process of the photoresist film 330 and then the etching using a processing gas containing a chlorine-containing gas. However, the present invention is not limited thereto, and the SiON film 320 may be etched by repeating the surface improving process of the photoresist film 330 and the etching process multiple times.

Figure 11:
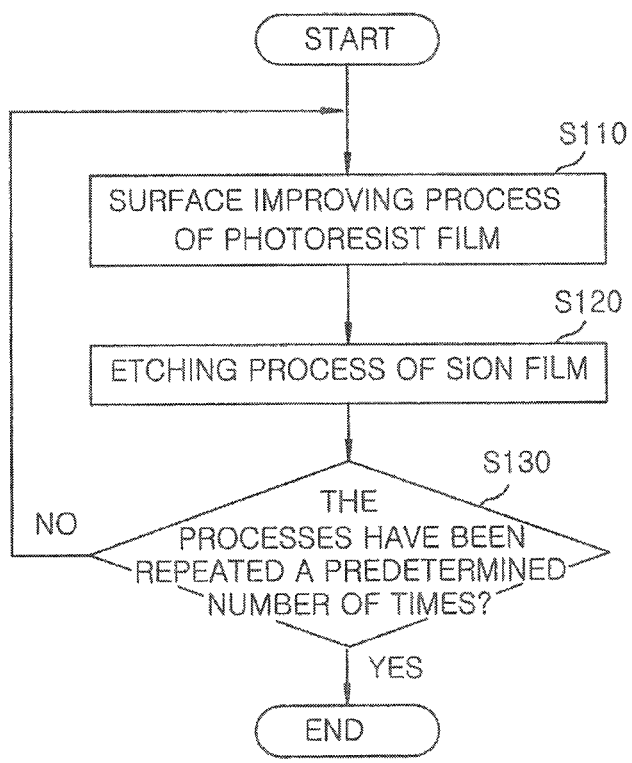
FIG. 11 is a flowchart of plasma processing of the embodiment of the present invention.

Hereinafter, the plasma processing of the present embodiment in which the surface improving process and the etching process of the photoresist film 330 can be repeatedly performed will be described with reference to the drawing. FIG. 11 is a flow chart showing the plasma processing of the present embodiment. The plasma processing is performed by controlling each component of the plasma processing apparatus 100 by the control unit 200. This flow chart may also be applied to the case of performing a surface improving process and an etching process only once.

As shown in FIG. 11, first, the control unit 200 performs the surface improving process of the photoresist film 330 in step S110. Specifically, a plasma is generated on the wafer W by introducing into the processing chamber 102 a processing gas, e.g., a hydrogen-containing gas (e.g., a gaseous mixture of $H_2$ gas and Ar gas) based on the aforementioned processing conditions of the surface improving process, thereby performing the plasma processing on the photoresist film 330 formed on the wafer W.

Next, in step S120, the SiON film 320 is etched. Specifically, a plasma is generated on the wafer W by introducing into the processing chamber 102 a processing gas, e.g., a gas containing a CHF-based gas, and an added gas, e.g., a chlorine-containing gas, under the processing conditions of the above etching process. Accordingly, the plasma processing is performed on the SiON film 320 on the wafer W while using as a mask the photoresist film 330 having the improved surface.

Thereafter, it is determined whether or not the processes have been repeated a predetermined number of times (e.g., three times) in step S130. If it is determined that the processes have not been repeated the predetermined number of times, the processing proceeds to the step S110, and the surface improving process of the photoresist film 330 and the etching process of the SiON film 320 are carried out. If it is determined that the processes have been repeated the predetermined number of times, a series of plasma processing is completed.

Here, the predetermined number of times (the number of repetition) of the surface improving process and the etching process may be arbitrarily set. The present invention may be applied to the case of not repeating the surface improving process and the etching process by setting the predetermined number of times to one. When the processes are repeated multiple times, the execution time of the surface improving process may vary.

In that case, the execution time of the first execution is preferably longer than the execution time of the second and subsequent executions. This is because, for a predetermined period of time, the effect of the surface improving process of the present embodiment is increased as the execution time is increased. Since, however, the surface improving effect is not increased after the predetermined period of time elapses, the execution time of the first surface improving process is preferably set to a period of time in which the surface improving effect is maximized (e.g., 30 sec) and the execution time of the second and subsequent executions is preferably set to a shorter period of time (e.g., 15 sec).

Further, the repetition number of times of the surface improving process and the etching process is preferably determined based on a period of time in which a plasma is stably generated or the like. In that case, it is preferably set such that the execution time of each process does not become excessively small. Here, the case in which the repetition number of times is set to three is described as an example.

(Experiment Result Obtained in the Case of Repeating The Surface Improving Process and the Etching Process)

Figure 12:
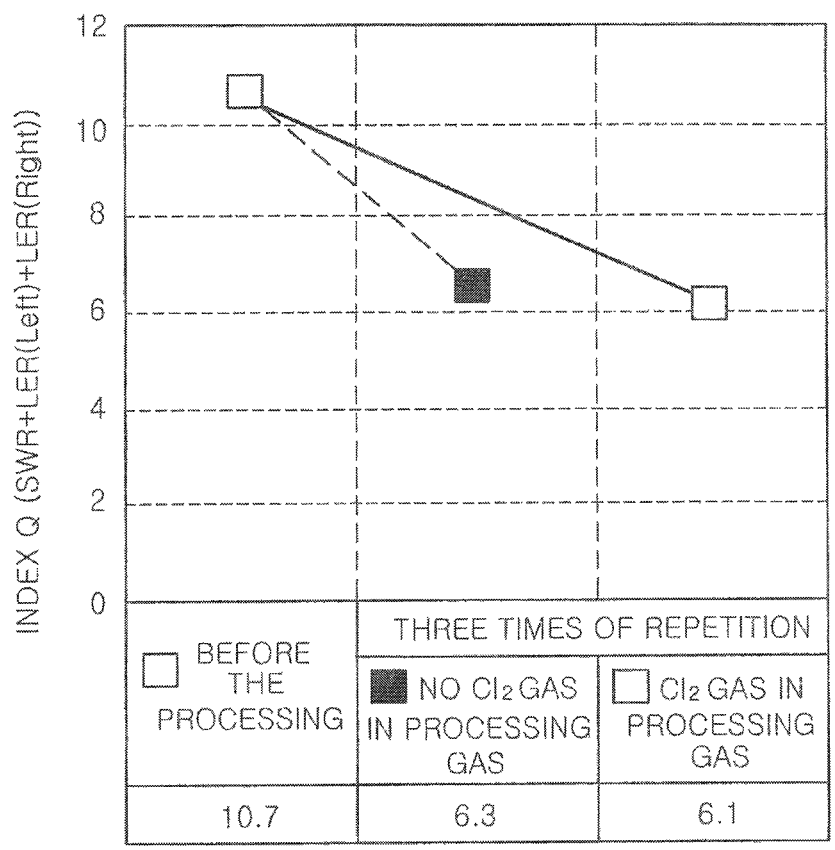
FIG. 12 is a table and a graph showing a experiment result in the case of repeating the surface improving process and the etching process of the embodiment of the present invention.

Here, the experiment result obtained by repeating the surface improving process and the etching process as described above is shown in FIG. 12. FIG. 12 is a table and a graph showing an experiment result obtained by repeatedly performing the surface improving process ($H_2$/Ar) and the etching process using the processing gas containing $Cl_2$ gas (chlorine-containing gas) three times, and the experiment result obtained by the surface improving process ($H_2$/Ar) and the etching process using a processing gas that does not contain $Cl_2$ gas (chlorine-containing gas) three times.

Here, the first surface improving process was performed for 30 sec, and the second and subsequence processes were performed for 15 sec. The first to the third etching process were each performed for 10 sec. The other processing conditions of the surface improving process and the etching process are the same as those of the experiment described in FIG. 8.

The experiment result of FIG. 12 shows that when the SiON film 320 was etched by repeating three times the surface improving process ($H_2$/Ar) and the etching process using a processing gas containing $Cl_2$ gas (chlorine-containing gas) in accordance with the present embodiment, the index Q indicating the pattern sidewall state was remarkably decreased from 10.7 that is an index before the processing to 6.1. This indicates that the etching can be performed while maintaining the surface state of the pattern sidewall. Further, when the surface improving process ($H_2$/Ar) and the etching process using a processing gas that does not contain $Cl_2$ gas (chlorine-containing gas), the index Q indicating the pattern sidewall state was decreased from 10.7 that is an index before the processing to 6.3. However, the decrease in the index Q was greater when the processing gas containing $Cl_2$ gas was used. Therefore, in the case of repeating the surface improving process and the etching process, it is preferable to use an etching processing gas containing $Cl_2$ gas (chlorine-containing gas).

Although a gaseous mixture of Ar gas and $H_2$ gas as a hydrogen-containing gas has been described as an example of the processing gas of the surface improving process of the above-described embodiment, the processing gas is not limited thereto.

As a hydrogen-containing gas, a gaseous mixture of, e.g., $H_2$ gas, $N_2$ gas, and $CH_4$ gas may be used as a processing gas. In that case as well, the effect of improving the surface of the photoresist film 330 can be obtained, and the etching can be performed while maintaining the improved pattern sidewall state of the photoresist film 330 by etching the SiON film 320 by using the processing gas including a gas containing a CHF-based gas to which a chlorine-containing gas is added.

(Experiment Result Obtained in the Case of Using a Different Processing Gas of the Surface Improving Process)

Figure 13:
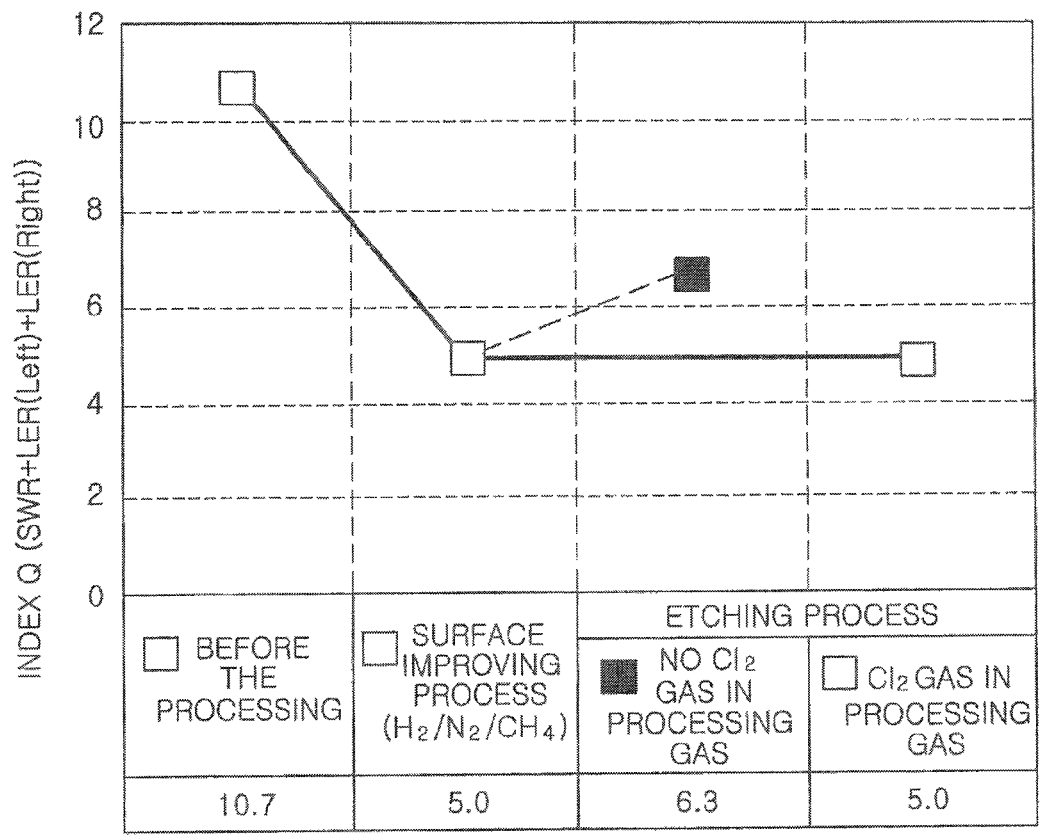
FIG. 13 is a table and a graph showing a experiment result in the case of performing another surface improving process ($H_2$ gas, $N_2$ gas, $CH_4$ gas) and the etching process in accordance with the embodiment of the present invention.

Here, the experiment result obtained by performing the surface improving process by using a gaseous mixture of $H_2$ gas, $N_2$ gas, and $CH_4$ gas as a processing gas will be described. Here, the experiment result obtained by performing the surface improving process and then etching SiON film 320 by using processing gas to which $Cl_2$ gas (chlorine-containing gas) is not added as in the case of the experiment shown in FIG. 8 will be compared. FIG. 13 is a graph and a table showing the experiment result. In FIG. 13, the vertical axis indicates an index Q of a pattern sidewall state. The index Q is the same as that in the experiment of FIG. 8. The surface improving process ($H_2$ gas, $N_2$ gas and $CH_4$ gas) have the following processing conditions.

[Processing Conditions of the Surface Improving Process ($H_2$ Gas, $N_2$ Gas and $CH_4$ Gas)]

Pressure in the processing chamber: 10 mTorr

Flow rate ratio of the processing gas: $H_2$ gas/$N_2$ gas/$CH_4$ gas=240/60/10 sccm Upper high frequency power: 60 MHz, 200 W Lower high frequency power: 13.56 MHz, 0 W As shown in FIG. 13, the index Q indicating the pattern sidewall state was remarkably decreased from 10.7 that is an index before the processing to 5.0 due to the surface improving process ($H_2$ gas, $N_2$ gas and $CH_4$ gas) of the present embodiment. This indicates the surface state of the pattern sidewall has been extremely improved. Since this is smaller than the index 6.0 obtained in the surface improving process ($H_2$/Ar) shown in FIG. 8, it is clear that the surface improving process ($H_2$ gas, $N_2$ gas and $CH_4$ gas) has a better surface improving effect than the surface improving process ($H_2$/Ar).

By performing the etching using the processing gas of the present embodiment to which $Cl_2$ gas is added after the surface improving process, the index Q indicating the pattern sidewall state becomes 5.0 that is the same as that obtained after the surface improving process. Therefore, it is clear that the etching can be performed while maintaining the surface state of the pattern sidewall.

On the other hand, when the etching was carried out by using the processing gas to which $Cl_2$ gas (chlorine-containing gas) is not added, the index Q indicating the pattern sidewall state is increased from 5.0 that is the index after the surface improving process to 6.3. This indicates that the surface state of the pattern sidewall becomes poor.

Even in the case of performing the surface improving process ($H_2$ gas, $N_2$ gas and $CH_4$ gas), if the etching process using the processing gas to which chlorine-containing gas is added is performed after the surface improving process of the photoresist film 330, the SiON film 320 can be etched while maintaining the improved surface state (the surface state of the pattern sidewall).

The above embodiment has described the case of applying a high frequency power only to the upper electrode 140 in the surface improving process using a gaseous mixture of $H_2$ gas and Ar gas, or the case of applying a high frequency power to both of the upper electrode 140 and the lower electrode 110 as an example. However, it has been found from the experiments that the surface improving effect can be further enhanced by applying a predetermined DC voltage to the upper electrode 140.

Since the DC voltage is applied to the upper electrode 140, a larger number of electrons generated in the plasma are irradiated from the upper electrode 140 toward the photoresist film 330 on the wafer W. Accordingly, the surface improving effect of the photoresist film 330 can be enhanced.

When the electrode plate 143 of the upper electrode 140 is made of a silicon material, the silicon of the electrode plate 143 is easily sputtered by the DC voltage applied to the upper electrode 140. The sputtered silicon is coated on the surface of the photoresist film 330 of the wafer W, so that the surface improving effect of the photoresist film 330 can be further enhanced.

(Experiment Result Obtained in the Case of Applying a DC Voltage to the Upper Electrode)

Figure 14:
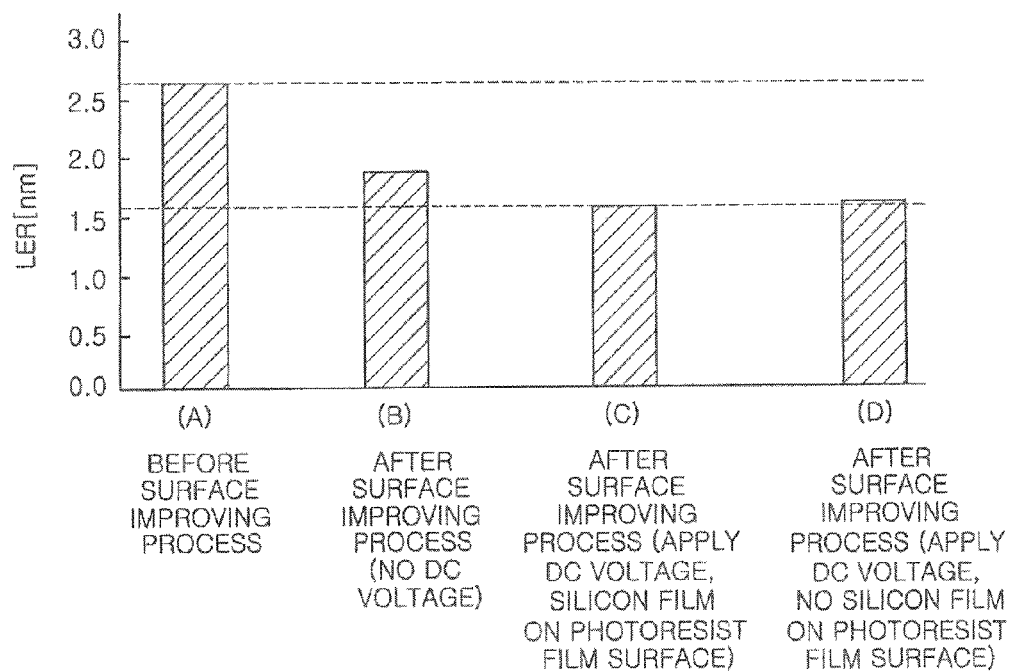
FIG. 14 is a graph showing a experiment result in the case of performing the surface improving process by applying a DC voltage to an upper electrode in the embodiment of the present invention.

Here, the experiment result obtained in the case of applying a DC voltage will be described with reference to the drawings. FIG. 14 is a graph showing the experiment result. The vertical axis indicates the aforementioned LER as an index for examining the surface improving effect. As the LER is decreased, the deviation of the line position is decreased and the surface improving effect is increased. In FIG. 14, (A) is a graph before the surface improving process, and (B) is a graph in the case of not applying a DC voltage; and (C) and (D) are graphs in the case of applying a DC voltage. In FIG. 14, (C) shows the case of forming a silicon film on the surface of the photoresist film 330, and (D) shows the case of not forming a silicon film on the surface of the photoresist film 330.

In this experiment, there was used the plasma processing apparatus 100 shown in FIG. 1 in which a predetermined DC voltage is applied to the upper electrode 140 from a variable DC power supply (not shown). For example, in case of (B), the surface improving process using a gaseous mixture of $H_2$ gas and Ar gas was performed by applying the high frequency power of 300 W to the upper electrode 140 without applying a DC voltage thereto. In cases of (C) and (D), the surface improving process was performed by applying the high frequency power of 300 W and a DC voltage (e.g., 1000 V) to the upper electrode 140.

Further, in case of (C), the gaseous mixture of $H_2$ gas and Ar gas was used. By using the gaseous mixture of $H_2$ gas and Ar gas as the processing gas and applying the high frequency power of 300 W and the DC voltage (e.g., 1000 V) to the upper electrode 140, the improvement of the surface of the photoresist film 330 by the electrons and by the formation of the silicon film can be achieved. In other words, when the DC voltage is applied to the upper electrode 140 in a state where Ar gas is contained in the processing gas, silicon of the electrode plate 143 is easily sputtered. Therefore, a silicon film is formed on the surface of the photoresist film 330.

In case of (D), only $H_2$ gas was used as the processing gas without adding Ar gas. By using $H_2$ gas as the processing gas and applying the high frequency power of 300 W and the DC voltage (e.g., 1000 V) to the upper electrode 140, the improvement of the surface of the photoresist film 330 by the electrons can be achieved. When Ar gas is not contained in the processing gas, even if the DC voltage is applied to the upper electrode 140, silicon of the electrode plate 143 is hardly sputtered and, thus, a silicon film is not formed on the surface of the photoresist film 330. Further, even in case of (D), if the electrode plate 143 of the upper electrode 140 is formed of a material that does not contain a silicon material, i.e., if silicon is not sputtered, a gaseous mixture of $H_2$ gas and Ar gas may be used as a processing gas.

In accordance with the experiment result shown in FIG. 14, LER is lower in the cases of (B), (C) and (D) than in case of (A). Thus, when the surface improving process is performed as in the cases of (B) (C) and (D), the surface of the photoresist film 330 is improved compared to the state before the surface improving process (A). Further, LER is considerably lower in the cases of (C) and (D) than in the case of (B), so that the surface improving effect is higher in the cases (C) and (D) of applying a DC voltage than in the case (B) of not applying a DC voltage.

Furthermore, LER is lower in the case of (C) than in the case of (D). Therefore, in the case of (C) where a silicon film is formed on the photoresist film 330, the surface improving effect is further increased compared to the case of (D) not forming a silicon film.

As described above, the experiment has shown that the surface improving effect can be enhanced by applying a predetermined DC voltage to the upper electrode 140. By performing the etching using a processing gas containing the aforementioned chlorine-containing gas after the processing having an enhanced surface improving effect, the SiON film 320 can be etched while maintaining the improved surface state obtained due to the enhanced surface improving effect. As a consequence, a better etching shape can be formed.

The surface improving process by the processing gas such as a gaseous mixture of $H_2$ gas and Ar gas or the like and the surface improving process by the silicon film formed on the surface of the photoresist film 330 may be consecutively carried out. Specifically, the surface improving process as the first surface improving process may be performed by using a gaseous mixture of $H_2$ gas and Ar gas and applying the high frequency power to the upper electrode 140 without applying a DC voltage and, then, the surface improving process as the second surface improving process may be performed by applying a DC voltage to the upper electrode 140.

Accordingly, the surface of the photoresist film 330 can be planarized by the first surface improving step and, then, the planarized surface of the photoresist film 330 can be coated with silicon by the second surface improving step. Next, etching using a processing gas containing a chlorine-containing gas may be performed. In that case, the surface improving process by the first and the second surface improving step and the etching using a processing gas containing a chlorine-containing gas may be repeated a predetermined number of times.

Figure 15:
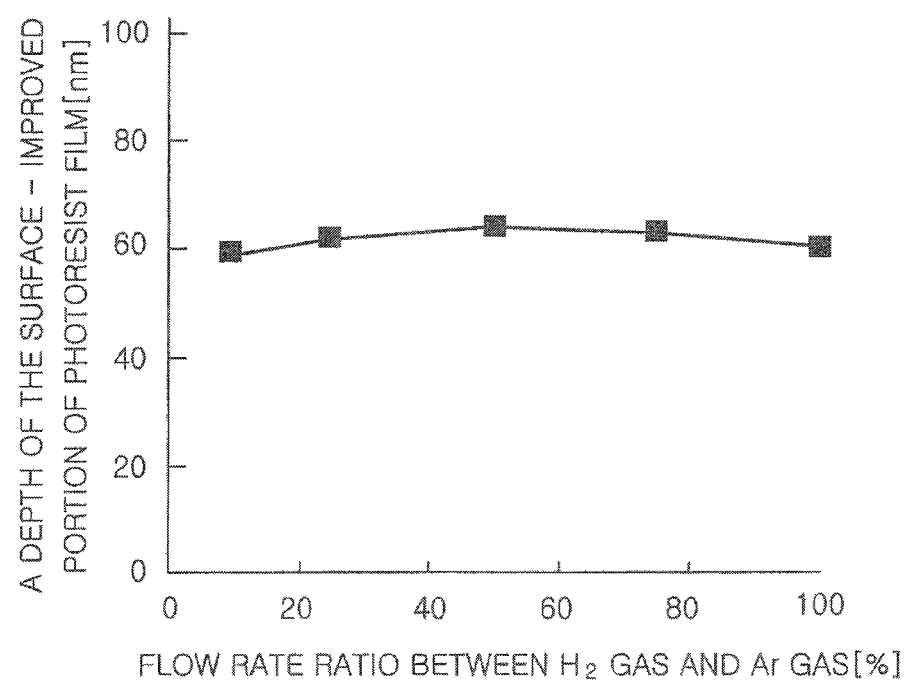
FIG. 15 is a graph showing relationship between a flow rate ratio between $H_2$ gas and Ar gas and the surface improving effect obtained in the case of performing the surface improving process by applying a DC voltage to the upper electrode in the present embodiment of the present invention.

As described above, it is found from the experiment that the surface improvement effect obtained in the case of applying a DC voltage to the upper electrode 140 is hardly changed even if the flow rate ratio of $H_2$ gas and Ar gas is changed. FIG. 15 is a graph showing relationship between the surface improvement effect obtained in the case of applying a DC voltage to the upper electrode 140 (here, the depth of the improved portion) and the flow rate ratio between $H_2$ gas and Ar gas. In FIG. 15, the vertical axis indicates a depth of the improved portion on the surface of the photoresist film 330, and the horizontal axis indicates the flow rate ratio between $H_2$ gas and Ar gas. In this experiment, the surface improving process was performed while varying the flow rate ratio between $H_2$ gas and Ar gas, and the depth of the improved portion in the surface of the photoresist film 330 was measured.

According to the experiment result shown in FIG. 15, it is clear that the depth of the improved portion in the surface of the photoresist film 330 is maintained at 60 nm even if the flow rate ratio of $H_2$ gas and Ar gas is changed. Accordingly, the flow rate ratio of $H_2$ gas and Ar gas can be adjusted without changing the depth of the improved portion in the surface of the photoresist film 330.

While the invention has been shown and described with respect to the embodiments, the present invention is not limited to the above-described examples. It will be understood by those skilled in the art that various changes and modification may be made without departing from the scope of the invention as defined in the following claims and they are also included in the technical field of the present invention.

For example, in the present embodiment, $Cl_2$ gas has been used as an example of the chlorine-containing gas that is added for the etching of the SiON film. However, the chlorine-containing gas is not limited thereto, and $BCl_3$ gas, $CCl_4$ gas or the like may be used. Therefore, the chlorine-containing gas may contain at least one of $Cl_2$ gas, $BCl_3$ gas, and $CCl_4$ gas. Further, the CHF-based gas contained in the gas containing a CHF-based gas may be $CH_2F_2$ gas or $CH_3F$ gas other than $CHF_3$ gas. The gas containing a CHF-based gas may contain a CF-based gas, and the CF-based gas may contain at least one of $CF_4$ gas and $C_4F_8$ gas.

The present invention can be applied to a plasma processing method for performing plasma etching on an etching target film on a substrate such as a semiconductor wafer, a liquid crystal substrate or the like while using a resist film as a mask.

What is claimed is:

1. A plasma processing method for performing plasma etching on a SiON film while using as a mask a photoresist film having a predetermined pattern, the method comprising:
    a surface improving step of improving a surface of the photoresist film by performing plasma processing using a hydrogen-containing gas as a processing gas; and
    an etching step of etching the SiON film by performing plasma processing using a processing gas including a gas containing a CHF-based gas and a chlorine-containing gas while using as a mask the photoresist film having the improved surface,
    wherein a high frequency power amount for plasma generation in the etching step is greater than a high frequency amount for plasma generation in the surface improving step.

2. The plasma processing method of claim 1, wherein the surface improving step and the etching step are repeated at least twice, and wherein an execution time of a first execution of the surface improving step is longer than an execution time of a second execution of the surface improving step.

3. The plasma processing method of claim 1, wherein the chlorine-containing gas contains at least one of $Cl_2$ gas, $BCl_3$ gas and $CCl_4$ gas.

4. The plasma processing method of claim 1, wherein the hydrogen-containing gas is a gaseous mixture of $H_2$ gas, $N_2$ gas and $CH_4$ gas.

5. The plasma processing method of claim 1, wherein the CHF-based gas is any one of $CH_2F_2$ gas, $CH_3F$ gas, and $CHF_3$ gas.

6. The plasma processing method of claim 5, wherein the gas containing the CHF-based gas and the chlorine-containing gas further contains a CF-based gas.

7. The plasma processing method of claim 6, wherein the CF-based gas contains at least one of $CF_4$ gas and $C_4F_8$ gas.

8. The plasma processing method of claim 1, wherein the processing gas including the gas containing the CHF-based gas and the chlorine-containing gas consists essentially of $CHF_3$ gas and $Cl_2$ gas.

9. The plasma processing method of claim 1, wherein the plasma processing method is performed by using a plasma processing apparatus comprising an upper electrode and a lower electrode, and wherein a DC voltage is applied to the upper electrode in the surface improving step.

10. The plasma processing method of claim 9, wherein the hydrogen-containing gas comprises Ar gas, and wherein the surface improving step comprises a first surface improving step performed without applying the DC voltage to the upper electrode and a second surface improving step performed by applying the DC voltage to the upper electrode.

11. A plasma processing method for performing plasma etching on an underlying film while using as a mask a photoresist film formed in a predetermined pattern on the underlying film, the method comprising:
    a first step of improving a surface of the photoresist film by performing plasma processing using a hydrogen-containing gas as a processing gas; and
    a second step of etching the underlying film by performing plasma processing using a processing gas including a gas containing a CHF-based gas and a chlorine-containing gas while using as a mask the photoresist film having the improved surface,
    wherein a high frequency power amount in the plasma processing of the second step is greater than a high frequency power amount in the plasma processing of the first step.

12. The plasma processing method of claim 11, wherein the first and the second step are repeated at least twice, and wherein an execution time of a first execution of the first step is longer than an execution time of a second execution of the first step.

13. The plasma processing method of claim 11, wherein the hydrogen-containing gas is a gaseous mixture of $H_2$ gas, $N_2$ gas and $CH_4$ gas.

14. The plasma processing method of claim 11, wherein the processing gas including the gas containing the CHF-based gas and the chlorine-containing gas consists essentially of $CHF_3$ gas and $Cl_2$ gas.

15. The plasma processing method of claim 11, wherein the plasma processing method is performed by using a plasma processing apparatus comprising an upper electrode and a lower electrode, and wherein a DC voltage is applied to the upper electrode in the first step.

16. The plasma processing method of claim 15, wherein the hydrogen-containing gas comprises Ar gas, and wherein the first step comprises a first surface improving step performed without applying the DC voltage to the upper electrode and a second surface improving step performed by applying the DC voltage to the upper electrode.

* * * * *